United States Patent
Bhardwaj et al.

(10) Patent No.: US 7,800,367 B2
(45) Date of Patent: Sep. 21, 2010

(54) **METHOD AND APPARATUS FOR GENERATING T2\* WEIGHTED MAGNETIC RESONANCE IMAGES**

(75) Inventors: Ravi Bhardwaj, Bangalore (IN); Anthony T. Vu, Waukesha, WI (US); Ramesh Venkatesan, Bangalore (IN)

(73) Assignee: General Electric Co., Schenectady, NY (US)

( * ) Notice: Subject to any disclaimer, the term of this patent is extended or adjusted under 35 U.S.C. 154(b) by 5 days.

(21) Appl. No.: 12/060,985

(22) Filed: Apr. 2, 2008

(65) Prior Publication Data

US 2009/0251140 A1  Oct. 8, 2009

(51) Int. Cl.
*G01V 3/00* (2006.01)
(52) U.S. Cl. ...................... 324/309; 324/307
(58) Field of Classification Search ......... 324/300–322; 600/407–435
See application file for complete search history.

(56) References Cited

U.S. PATENT DOCUMENTS

| | | | |
|---|---|---|---|
| 5,459,400 A * | 10/1995 | Moonen | 324/309 |
| 5,860,921 A * | 1/1999 | Ma et al. | 600/410 |
| 6,501,272 B1 * | 12/2002 | Haacke et al. | 324/306 |
| 6,658,280 B1 | 12/2003 | Haacke | |
| 6,856,134 B1 * | 2/2005 | Reeder et al. | 324/309 |
| 7,064,545 B2 * | 6/2006 | Zaharchuk et al. | 324/307 |
| 7,368,910 B2 * | 5/2008 | Bammer et al. | 324/306 |
| 7,545,967 B1 * | 6/2009 | Prince et al. | 382/130 |
| 7,567,832 B2 * | 7/2009 | Schmainda et al. | 600/410 |
| 7,573,265 B2 * | 8/2009 | Haacke | 324/306 |
| 2009/0076374 A1 * | 3/2009 | Kimura et al. | 600/410 |

FOREIGN PATENT DOCUMENTS

EP    1 136 836 A2 *  3/2001

OTHER PUBLICATIONS

Reichenbach PhD et al., Small Vessels in the Human Brain: MR Venography with Deoxyhemoglobin as an Intrinsic Contrast Agent, Radiology 204: 272-277 (1997).
Haacke et al., Susceptibility Weighted Imaging (SWI), Magnetic Resonance in Medicine 52:612-618 (2004).
Reichenbach et al., High Resolution BOLD Venographic Imaging: a window into brain function, NMR in Biomedicine, NMR Biomed. 14:453-467 (2001).

\* cited by examiner

*Primary Examiner*—Brij B Shrivastav (57) ABSTRACT

A method for generating a susceptibility (or T2\*) weighted magnetic resonance (MR) image includes defining a pulse sequence having a plurality of gradient echoes and acquiring MR data for each of the plurality of gradient echoes. A weighting function is applied to image data for each gradient echo such as MR data (e.g., k-space data) or magnitude images associated with each gradient echo. A susceptibility weighted image is generated by combining the image data for each gradient echo based on at least the application of the weighting function.

24 Claims, 4 Drawing Sheets

METHOD AND APPARATUS FOR GENERATING T2* WEIGHTED MAGNETIC RESONANCE IMAGES

TECHNICAL FIELD

The present invention relates generally to magnetic resonance imaging (MRI) systems and in particular, to a method and apparatus for generating a T2* (or susceptibility) weighted magnetic resonance images using a multi-echo acquisition.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MR images may be created by applying currents to the gradient and RF coils according to known algorithms called "pulse sequences." The selection of a pulse sequence determines the relative appearance of different tissue types in the resultant images. Various properties of tissue may be used to create images with a desirable contrast between different tissues. T2* (T2 star) or susceptibility weighted contrast arises from local inhomogeneities of the magnetic field among tissues. T2* weighted contrast may be used for a number of applications including, but not limited to, enhanced detection of stroke and hemorrhage, tumors, microhemorrhages in trauma patients and occult vascular diseases (e.g., cavernomas, angiomas and telengiectasias), and for applications such as separating arteries and veins, imaging venous vascular networks and measuring iron buildup in neurodegenerative diseases.

Typically, conventional gradient echo (GRE) or echo planar imaging (EPI) pulse sequences are used to achieve T2* (or susceptibility) weighted contrast. GRE and EPI sequences use a gradient reversal to form an echo rather than an RF refocusing pulse. Accordingly, GRE and EPI sequences are sensitive to the magnetic susceptibility of different tissue types. The differences in magnetic susceptibility between tissue types causes magnetic field inhomogeneity and signal loss. GRE and EPI sequences used for T2* weighted imaging, however, may have a low signal-to-noise ratio (SNR) and low spatial resolution capability that can limit the applications for T2* weighted contrast imaging. It would be desirable to provide a method and apparatus for generating (e.g., acquisition and reconstruction) a T2* weighted MRI image that improves susceptibility sensitivity and SNR.

BRIEF DESCRIPTION OF THE INVENTION

In accordance with an embodiment, a method for generating a susceptibility weighted magnetic resonance (MR) image includes defining a pulse sequence having a plurality of gradient echoes, acquiring MR data for each of the plurality of gradient echoes, generating image data for each of the plurality of gradient echoes based on the MR data acquired for the corresponding gradient echo, applying a weighting function to the image data for each gradient echo and generating a susceptibility weighted image by combining the image data for each gradient echo based on at least the application of the weighting function.

In accordance with another embodiment, a method for generating a susceptibility weighted magnetic resonance (MR) image includes defining a pulse sequence having a plurality of gradient echoes, acquiring MR data for each of the plurality of gradient echoes, applying a weighting function to the MR data for each gradient echo, generating a combined set of MR data by combining the MR data for each gradient echo based on at least the application of the weighting function and generating a susceptibility weighted image using the combined set of MR data.

In accordance with another embodiment, a magnetic resonance (MR) imaging apparatus includes a magnetic resonance imaging assembly comprising a magnet, a plurality of gradient coils, at least one radio frequency coil, a radio frequency transceiver system and a pulse generator module and a controller coupled to the magnetic resonance imaging assembly and programmed to control the magnetic resonance imaging assembly to acquire MR data using a pulse sequence having a plurality of gradient echoes, the controller further programmed to generate a susceptibility weighted image by applying a weighting function to image data associated with each gradient echo and combining the image data for each gradient echo based at least on the application of the weighting function.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
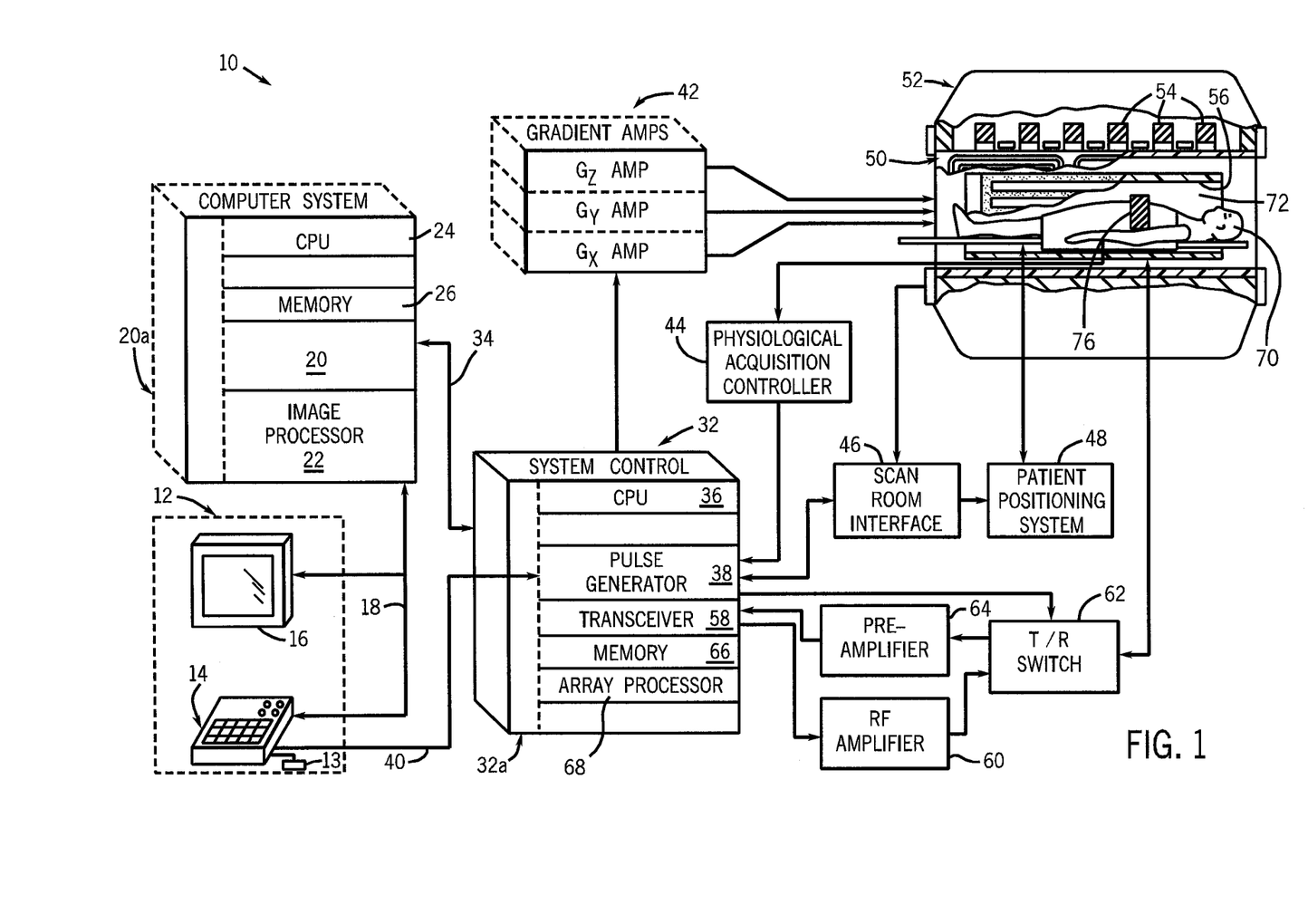
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., imaging assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of an imaging assembly 52 that includes a polarizing magnet 54 and a whole-body RF coil 56, surface or parallel imaging coils 76 or both. The coils 56, 76 may be configured for both transmitting and receiving or for transmit-only or receive-only. A patient or imaging subject 70 may be positioned within a cylindrical patient imaging volume 72 of the imaging assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored in the memory module 66 until they are subsequently transformed to create images. An array processor 68 uses a known transformation method, most commonly a Fourier transform, to create images from the MR signals. System control computer 32 (and/or computer 20) may also be configured to perform an image reconstruction process as described further below. The images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

Figure 2:
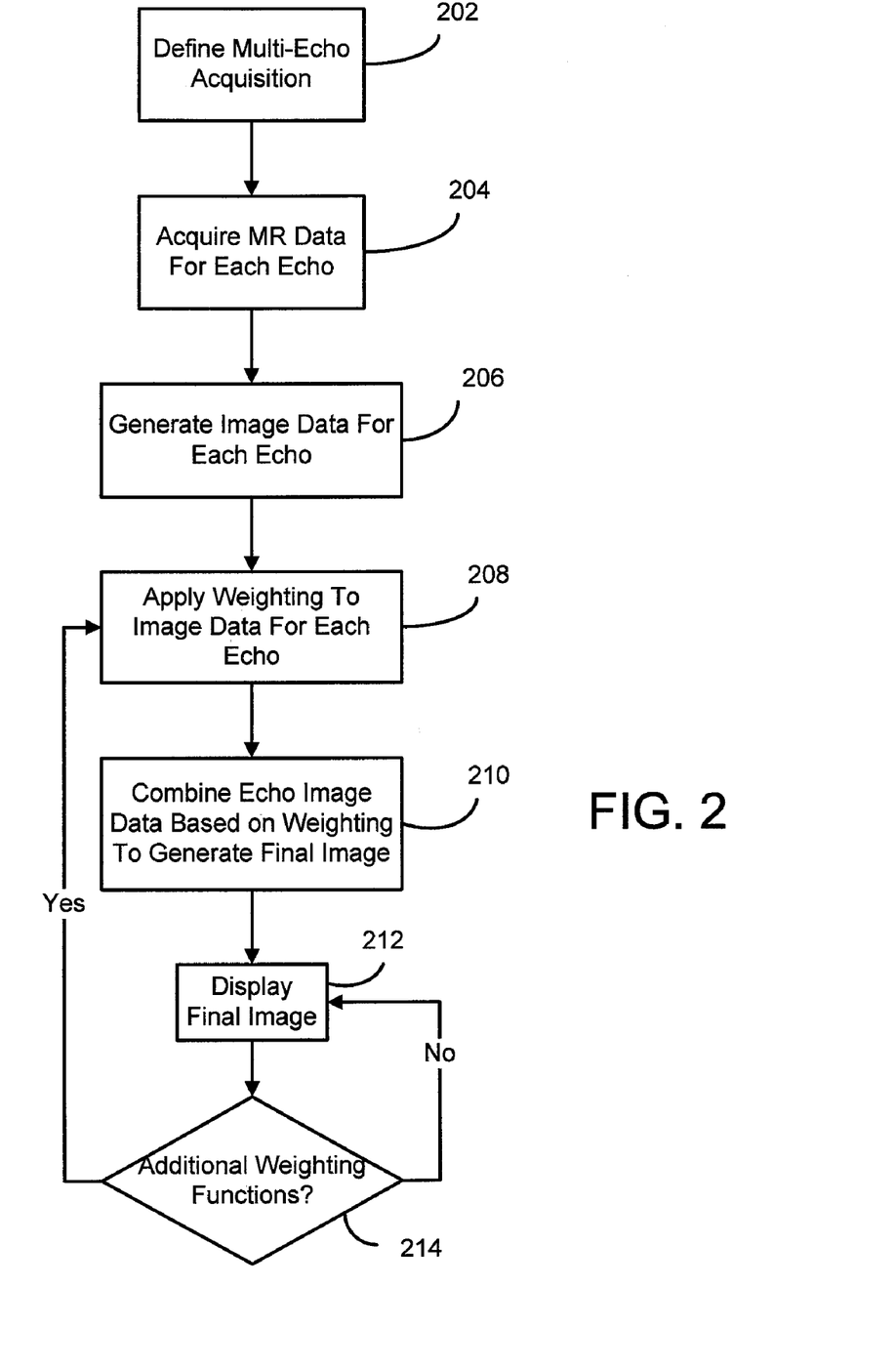
FIG. 2 illustrates a method for generating a T2* (or susceptibility) weighted magnetic resonance image using a multi-echo gradient echo acquisition and selectively weighted reconstruction in accordance with an embodiment.

FIG. 2 illustrates a method for generating a T2* (or susceptibility) weighted magnetic resonance image using a multi-echo gradient echo acquisition and selectively weighted reconstruction in accordance with an embodiment. The method or technique of FIG. 2 is compatible with and may be implemented using an MRI system such as described above with respect to FIG. 1 or any similar or equivalent system for obtaining MR images. At block 202, a multi-echo acquisition is defined by selecting a pulse sequence and by identifying (e.g., by a user or operator) various scan parameters, for example, field of view (FOV), matrix size, flip angle, receiver bandwidth, TR (repetition time), number of echoes, acceleration, shot length (if appropriate) and number of shots (if appropriate). The pulse sequence may be any two-dimensional (2D) or three-dimensional (3D) multi-echo gradient echo sequence with a plurality of gradient echoes (e.g., at least two gradient echoes) acquired at different echo times (TE). In one embodiment, each echo (or echo time) may correspond with a different T2* weighting. The selected (e.g., automatically or by a user) multi-echo gradient echo sequence may have other features or characteristics appropriate for the particular imaging application, for example, bipolar readout, uni-polar readout, flow compensation (single or multiple axis), multi-shot or interleaved multi-shot.

Figure 3:
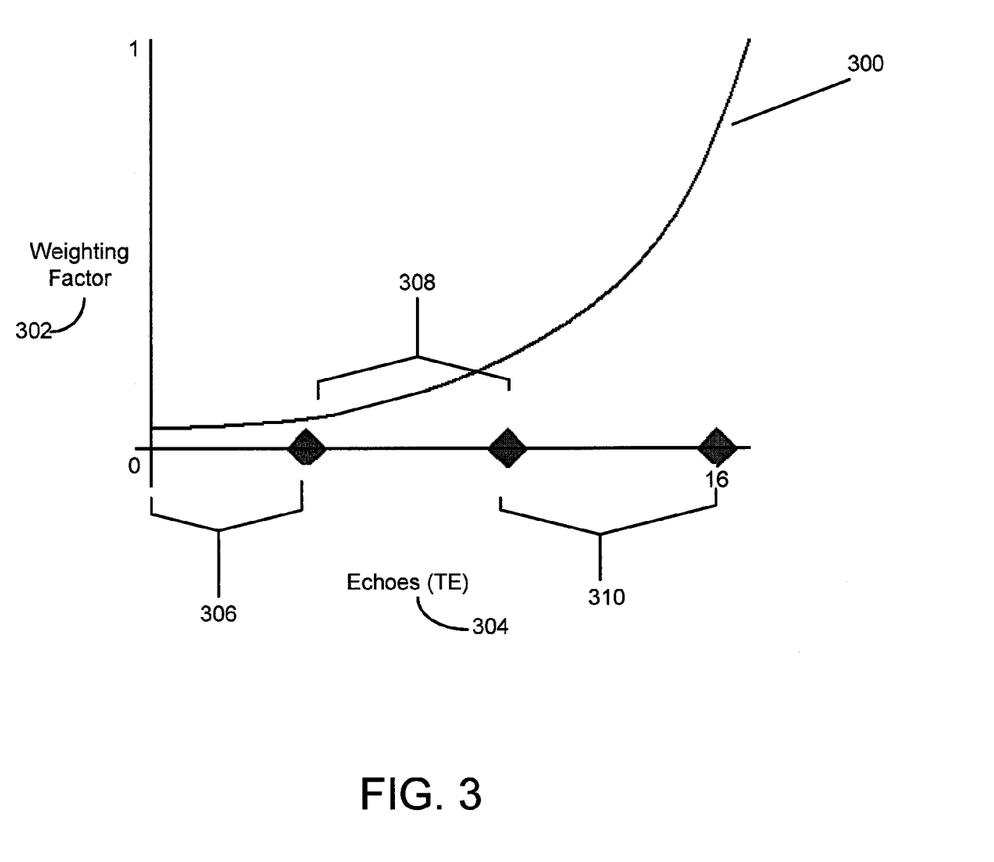
FIG. 3 illustrates an exemplary weighting function for emphasizing visualization of a venous vascular network in accordance with an embodiment.

In addition, a weighting function (or multiple weighting functions) to be used during the image reconstruction process (described further below) may be selected (e.g., automatically or by a user) during prescription or definition of the multi-echo acquisition. The weighting function may be selected based on the clinical application or type of exam, for example, the weighting function can be selected to enhance T2* contrast among tissues in the spinal cord for Axial C-spine imaging. Other applications compatible with the technique described herein include, but are not limited to, detection of various conditions or diseases such as stroke and hemorrhage, tumors, micro-hemorrhages in trauma patients or occult vascular diseases and applications such as separating arteries and veins, imaging venous vascular networks, measuring iron buildup in neurodegenerative diseases, measuring iron in the heart or liver, and other T2* weighting applications. The weighting function is tailored to selectively emphasize, suppress or equalize the T2* weighting from different echoes in the multi-echo acquisition. The weighting function can be linear or non-linear as required by the clinical application. Examples of weighting functions include, but are not limited to, a decreasing exponential weighting function, a Gaussian weighting function or an increasing exponential weighting function. A decreasing exponential weighting function may be used to, for example, enhance the arterial blood vessels for early (short TE) echoes. A Gaussian weighting function may be used to, for example, emphasize a middle group of echoes for stronger susceptibility weighting. An increasing exponential weighting function may be used to, for example, enhance visualization of a venous vascular network for later echoes (long TE). FIG. 3 illustrates an exemplary weighting function for emphasizing visualization of a venous vascular network in accordance with an embodiment. In FIG. 3, the weighting function 300 is applied to a multi-echo sequence with sixteen (16) gradient echoes 304 (or echo times (TE)). The weighting or scaling factor ($W_i$) 302 is between 0 and 1. For example, a weighting factor, $W_i$ (where i is the echo number), of 1 denotes a 100% signal contribution of a particular echo, a weighting factor of 0.5 denotes a 50% signal contribution of a particular echo and a weighting factor of zero (0) denotes a suppressed signal (i.e., no signal contribution from a particular echo). The echoes, 1-16, may be divided into different regions, for example, a first region 306 including short TE echoes, a second (or middle) region 308 including medium TE range echoes and a third (or last) region 310 including long TE echoes. The weighting function 300 shown in FIG. 3 is configured to emphasize the images from echoes in the third region 310 which is useful to, for example, visualize a venous vascular network.

Returning to FIG. 2, in one embodiment multiple images with different T2* image contrasts may be generated from the same acquisition. Accordingly, multiple weighting functions may be selected and used to reconstruct images with different T2* contrasts (or susceptibility sensitivity) using the MR data from the same acquisition. For example, a first weighting function may be selected to generate a proton density or time-of-flight arterial angiogram from short TE echoes, a second weighting function may be selected to generate susceptibility weighted contrast from medium TE range echoes and a third weighting function may be selected to generate a small venous angiogram from long TE echoes.

At block 204, magnetic resonance (MR) data (e.g., k-space data or raw data) is acquired for each echo of the acquisition defined at block 202. Once MR data is acquired for each echo, image data is generated for each echo at block 206. The image data includes complex image data generated by applying a Fourier Transform (e.g., an inverse Fourier Transform) to the MR data for an echo. In another embodiment, the complex image data can be converted into modulus form (e.g., a magnitude signal or image). The magnitude signal for each complex image data point is equal to the square root of the sum of squares of the real and/or imaginary parts of the complex image data point. At block 208, the selected weighting function is applied (e.g., multiplied) to the image data (either in complex or modulus form) for each echo to determine the contribution of the image for the particular echo. At block 210, the weighted individual echo magnitude images (e.g., image data) are combined to generate a final T2* weighted image.

In one embodiment, the weighted echo images may be combined using weighted averaging given by:

$$Isw = \frac{\sum_{i=n}^{m} Wi * I(TEi)}{(m-n+1)} \quad \text{Eqn. 1}$$

where Isw is the signal intensity of the final T2* (susceptibility) weighted image, Wi is the weighting factor determined using the weighting function, I(TEi) is the signal intensity of an individual echo image, and the echo index is from n to m. As described above, I(TEi) can be in complex or modulus form as well as real or imaginary components only. In another embodiment, the weighted echo images may be combined using a sum-of-squares weighted averaging given by:

$$Isw = \frac{\sqrt{\sum_{i=n}^{m}(Wi * I(TEi))^2}}{(m-n+1)} \quad \text{Eqn. 2}$$

where Isw is the signal intensity of the final T2* (susceptibility) weighted image, Wi is the weighting factor determined using the weighting function, I(TEi) is the signal intensity of an individual echo image and the echo index is from n to m. As mentioned above, I(TEi) can be in complex or modulus form as well as real or imaginary components only. In other embodiments, other known approaches may be used to combine the weighted echo images (e.g., weighted image data) to generate a final T2* (or susceptibility) weighted image.

At block 212, the final T2* weighted image may be displayed to a user using, for example, a MRI system display 16 (shown in FIG. 1). As mentioned above, multiple weighting functions may be selected at block 202 so that the same acquisition may be used to generate multiple images with different T2* contrasts. Alternatively, an additional weighting function may be selected (e.g., by a user or automatically)

at block 214 to generate an another image with a different T2* contrast. At block 214, if another weighting function was selected, the process returns to block 208. The second weighting function is applied to the image data for each echo to determine the contribution of the image for the particular echo. At block 210, the weighted echo image data for each echo are combined to form a final T2* weighted image as described above. The second T2* weighted image may then be displayed at block 212. If there are further selected weighting functions, steps 208 and 210 may be repeated to generate additional T2* weighted images with varying T2* contrasts (e.g., different types of T2* contrast images) using the same acquisition. If there are no further weighting functions to be applied at block 214, the final image or image(s) are displayed and the process ends.

The technique shown in FIG. 2 is described above in terms of generating a susceptibility weighted image for one spatial location. In an alternative embodiment, the technique in FIG. 2 (e.g., blocks 206 to 210) may be applied to the MR data acquired at block 204 to generate a susceptibility weighted image for additional spatial locations resulting in a set of susceptibility weighted images, each corresponding to a different spatial location. For a two-dimensional (2D) sequence, more than one acquisition may be required (e.g., a first acquisition for a first image or slice, a second acquisition for a second image or slice, etc. or an interleaved set of acquisitions, each acquiring a part of the data for a particular image or slice). For a three-dimensional (3D) sequence, one acquisition may acquire the data need for the plurality of spatial locations. Once the set of susceptibility weighted images is acquired (e.g., one for each spatial location), a technique such as Maximum Intensity Projection (MIP) or Minimum Intensity Projection (mIP) may be applied to the set of susceptibility weighted images to generate a single image. The MIP or mIP techniques can be used to enhance, for example, visualization of angiograms or blood vessels.

In another embodiment, the technique described above with respect to FIG. 2 is compatible with (e.g., may be used in combination with) other reconstruction techniques to further enhance susceptibility weighting. For example, the technique described herein may be used in combination with weighted phase mask reconstruction. In particular, at block 206, known techniques for weighted phase mask reconstruction may be used to generate a susceptibility weighted image for each gradient echo of the multi-echo pulse sequence from the acquired MR data. A single combined susceptibility weighted image may then be generated by applying a selected weighting function (block 208) to the susceptibility weighted image for each echo. The weighted susceptibility images for each echo are then combined (block 210) using, for example, weighted averaging or sum-of-squares weighted averaging as described above with respect to FIG. 2, resulting in a single combined susceptibility weighted image.

Figure 4:
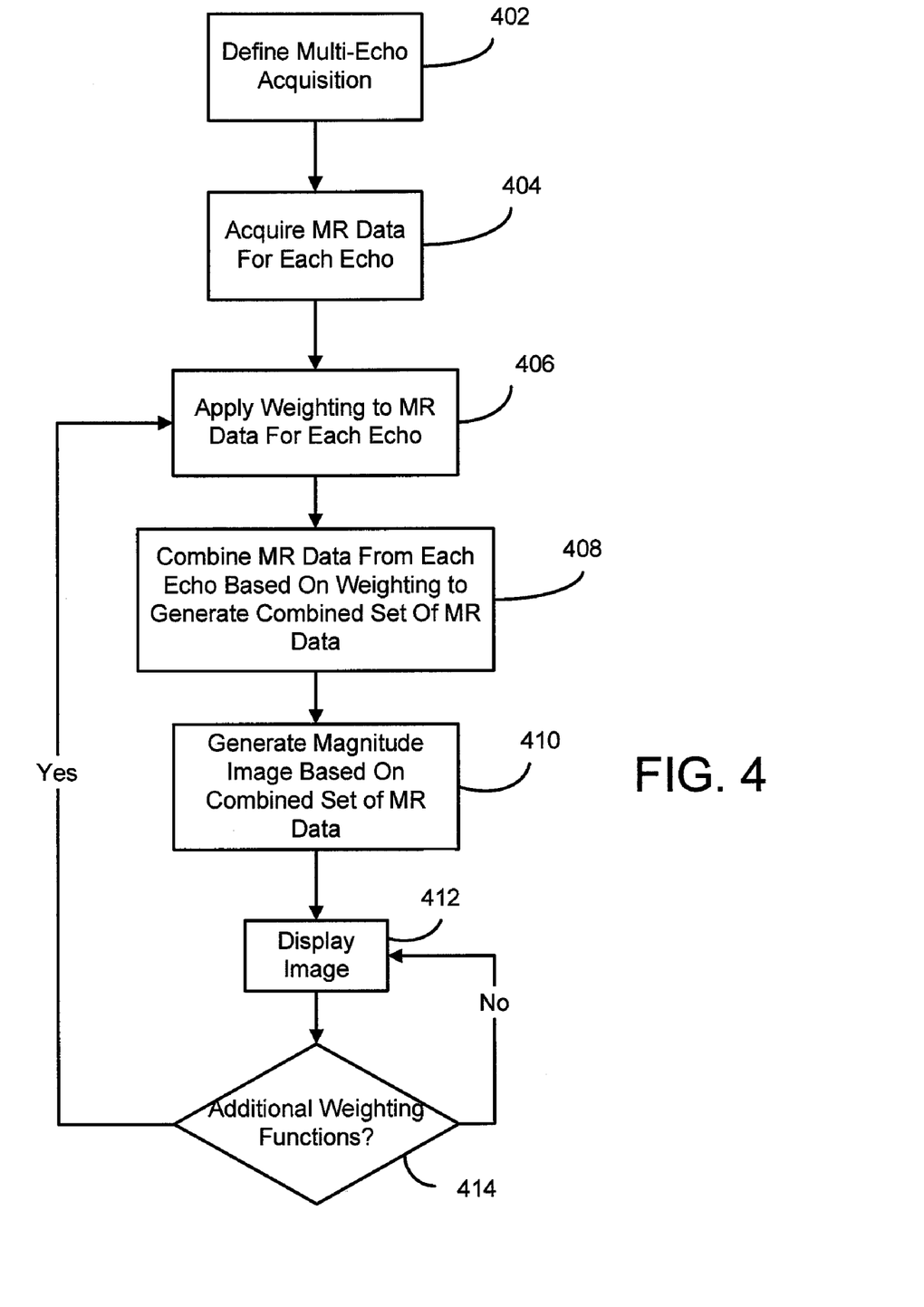
FIG. 4 illustrates a method for generating a T2* (or susceptibility) weighted magnetic resonance image using a multi-echo gradient echo acquisition and selectively weighted reconstruction in accordance with an alternative embodiment.

In an alternative embodiment, the weighting and combination of echo data can be performed with the k-space (or raw data or MR data) for each echo. FIG. 4 illustrates a method for generating a T2* (or susceptibility) weighted magnetic resonance image using a multi-echo gradient echo acquisition and selectively weighted reconstruction in accordance with an alternative embodiment. The method or technique of FIG. 4 is compatible with and may be implemented using an MRI system such as described above with respect to FIG. 1 or any similar or equivalent system for obtaining MR images. At block 402, a multi-echo acquisition is defined by selecting a pulse sequence and by identifying (e.g., by a user or operator) various scan parameters, for example, field of view (FOV), matrix size, flip angle, receiver bandwidth, TR (repetition time), number of echoes, acceleration, shot length (if appropriate) and number of shots (if appropriate). The pulse sequence may be any two-dimensional (2D) or three-dimensional (3D) multi-echo gradient echo sequence with a plurality of echoes acquired at different echo times (TE). In one embodiment, each echo (or echo time) may correspond with a different T2* weighting. The selected (e.g., automatically or by a user) multi-echo gradient echo sequence may have other features or characteristics appropriate for the particular imaging application, for example, bi-polar readout, uni-polar readout, flow compensation (single or multiple axis), multi-shot or interleaved multi-shot.

As described above with respect to FIG. 2, a weighting function (or multiple weighting functions) to be used during the image reconstruction process (described further below) may be selected (e.g., automatically or by a user) during prescription or definition of the acquisition. The weighting function is tailored to selectively emphasize, suppress or equalize the T2* weighting from different echoes in the multi-echo acquisition. In one embodiment, multiple images with different T2* image contrasts may be generated from the same acquisition. Accordingly, multiple weighting functions may be selected and used to reconstruct images with different T2* contrasts (or susceptibility sensitivity) using the MR data from the same acquisition.

At block 404, magnetic resonance (MR) data (e.g., k-space data or raw data) is acquired for each echo of the acquisition defined at block 402. Once MR data is acquired for each echo, the selected weighting function is applied (e.g., multiplied) to the MR data for each echo at block 406 to determine the contribution of the MR data of the particular echo. At block 408, the weighted MR data for each echo is combined to generate a single combined set of MR data. As discussed above with respect to FIG. 2, various approaches may be used to combine the weighted echo MR data such as weighted averaging and sum-of-squares weighted averaging. At block 410, a magnitude image with T2* weighted contrast is generated from the combined set of MR data. First the combined set of MR data is Fourier transformed to generate complex image data. A magnitude image can then be generated by determining a magnitude signal for each complex image data point. The magnitude signal for each complex image data point is equal to the square root of the sum of squares of the real and/or imaginary parts of the complex image data point. At block 412, the T2* weighted magnitude image may be displayed to a user using, for example, a MRI system display 16 (shown in FIG. 1).

As described above, multiple weighting functions may be selected at block 402 so that the same acquisition may be used to generate multiple images with different T2* contrasts. At block 414, if another weighting function was selected, the process returns to block 406. The second weighting function is applied to the MR data for each echo to determine the contribution of the MR data for the particular echo. At block 408, the weighted MR data for each echo is combined to generate a single combined set of MR data as described above. At block 410, a magnitude image with T2* weighted contrast is generated from the combined set of MR data. The second T2* weighted image may then be displayed at block 412. If there are further selected weighting functions, steps 406-410 may be repeated to generate additional T2* weighted images with varying T2* contrasts (e.g., different types of T2* contrast images) using the same acquisition. If there are no further weighting functions to be applied at block 414, the final image or image(s) are displayed and the process ends.

The technique shown in FIG. 4 is described above in terms of generating a susceptibility weighted image for one spatial location. In an alternative embodiment, the technique in FIG. 4 (e.g., blocks 406 to 410) may be applied to the MR data acquired at block 404 to generate a susceptibility weighted image for additional spatial locations resulting in a set of susceptibility weighted images, each corresponding to a different spatial location. For a two-dimensional (2D) sequence, more than one acquisition may be required (e.g., a first acquisition for a first image or slice, a second acquisition for a second image or slice, etc. or an interleaved set of acquisitions, each acquiring a part of the data for a particular image or slice). For a three-dimensional (3D) sequence, one acquisition may acquire the data need for the plurality of spatial locations. Once the set of susceptibility weighted images is acquired (e.g., one for each spatial location), a technique such as Maximum Intensity Projection (MIP) or Minimum Intensity Projection (mIP) may be applied to the set of susceptibility weighted images to generate a single image. The MIP or mIP techniques can be used to enhance, for example, visualization of angiograms or blood vessels.

Computer-executable instructions for generating a magnetic resonance image according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

A technical effect of the disclosed method and apparatus is that it provides for a computer-implemented technique for generating magnetic resonance images using a multi-echo pulse sequence and selectively weighted reconstruction.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for generating a susceptibility weighted magnetic resonance (MR) image, the method comprising:
    defining a pulse sequence having a plurality of gradient echoes;
    acquiring MR data for each of the plurality of gradient echoes;
    generating image data for each of the plurality of gradient echoes based on the MR data acquired for the corresponding echo;
    applying a weighting function to the image data for each gradient echo; and
    generating a susceptibility weighted image by combining the image data for each gradient echo based on at least the application of the weighting function.

2. A method according to claim 1, further comprising displaying the susceptibility weighted image.

3. A method according to claim 1, wherein each of the plurality of gradient echoes has a different echo time (TE).

4. A method according to claim 1, wherein each of the plurality of gradient echoes corresponds to a different T2* weighted contrast.

5. A method according to claim 1, wherein the image data is complex image data.

6. A method according to claim 1, wherein the image data is magnitude image data.

7. A method according to claim 1, wherein combining the image data comprises determining a weighted average of the image data.

8. A method according to claim 1, wherein combining the image data comprises determining a sum-of-squares weighted average of the image data.

9. A method according to claim 1, further comprising:
    applying a second weighting function to the image data for each gradient echo; and
    generating a second susceptibility weighted image by combining the image data for each gradient echo based on at least the application of the second weighting function.

10. A method according to claim 9, further comprising displaying the second susceptibility weighted image.

11. A method according to claim 1, wherein generating image data for each of the plurality of gradient echoes based on the MR data acquired for the corresponding echo comprises generating a susceptibility weighted image for each gradient echo using a weighted phase mask reconstruction technique.

12. A method for generating a susceptibility weighted magnetic resonance (MR) image, the method comprising:
    defining a pulse sequence having a plurality of gradient echoes;
    acquiring MR data for each of the plurality of gradient echoes;
    applying a weighting function to the MR data for each gradient echo;
    generating a combined set of MR data by combining the MR data for each gradient echo based on at least the application of the weighting function; and
    generating a susceptibility weighted image using the combined set of MR data.

13. A method according to claim 12, further comprising displaying the susceptibility weighted image.

14. A method according to claim 12, wherein each of the plurality of gradient echoes has a different echo time (TE).

15. A method according to claim 12, wherein each of the plurality of gradient echoes corresponds to a different T2* weighted contrast.

16. A method according to claim 12, wherein combining the MR data comprises determining a weighted average of the MR data.

17. A method according to claim 12, wherein combining the MR data comprises determining a sum-of-squares weighted average of the MR data.

18. A method according to claim 12, further comprising:
    applying a second weighting function to the MR data for each gradient echo;

generating a second combined set of MR data by combining the MR data for each gradient echo based at least one the application of the weighting function; and generating a second susceptibility weighted image using the second combined set of MR data.

19. A method according to claim 18, further comprising displaying the second susceptibility weighted image.

20. A magnetic resonance (MR) imaging apparatus comprising:
a magnetic resonance imaging assembly comprising a magnet, a plurality of gradient coils, at least one radio frequency coil, a radio frequency transceiver system and a pulse generator module; and
a controller coupled to the magnetic resonance imaging assembly and programmed to control the magnetic resonance imaging assembly to acquire MR data using a pulse sequence having a plurality of gradient echoes, the controller further programmed to generate a susceptibility weighted image by applying a weighting function to image data associated with each gradient echo and combining the image data for each gradient echo based at least on the application of the weighting function.

21. An MR imaging apparatus according to claim 20, wherein the image data comprises magnitude images associated with each of the plurality of gradient echoes.

22. An MR imaging apparatus according to claim 20, wherein the image data comprises complex image data associated with each of the plurality of gradient echoes.

23. An MR imaging apparatus according to claim 20, wherein combining the image data comprises determining a weighted average of the image data.

24. An MR imaging apparatus according to claim 20, wherein combining the image data comprises determining a sum-of-squares weighted average of the image data.

* * * * *